(12) United States Patent
Kyzlink et al.

(10) Patent No.: US 10,997,045 B2
(45) Date of Patent: May 4, 2021

(54) UNIVERSAL AUTOMATED TESTING OF EMBEDDED SYSTEMS

(71) Applicant: Y Soft Corporation, a.s., Prague (CZ)

(72) Inventors: Jiri Kyzlink, Prague (CZ); Vaclav Novotny, Prague (CZ); Ales Pernikar, Prague (CZ); Jakub Pavlak, Prague (CZ); Ondrej Krajicek, Brno (CZ)

(73) Assignee: Y Soft Corporation, a.s., Brno (CZ)

( * ) Notice: Subject to any disclaimer, the term of this patent is extended or adjusted under 35 U.S.C. 154(b) by 611 days.

(21) Appl. No.: 15/788,313

(22) Filed: Oct. 19, 2017

(65) Prior Publication Data

US 2018/0113774 A1 Apr. 26, 2018

Related U.S. Application Data

(60) Provisional application No. 62/410,666, filed on Oct. 20, 2016.

(51) Int. Cl.
*G06F 11/22* (2006.01)
*G06F 11/263* (2006.01)
(Continued)

(52) U.S. Cl.
CPC ...... *G06F 11/2273* (2013.01); *G01R 31/2829* (2013.01); *G01R 31/2834* (2013.01);
(Continued)

(58) Field of Classification Search
CPC ............ G01R 31/2846; G01R 31/2829; G01R 31/2834; G01R 31/31907;
(Continued)

(56) References Cited

U.S. PATENT DOCUMENTS

2005/0028133 A1    2/2005   Ananth et al.
2006/0095893 A1    5/2006   Vahid et al.
(Continued)

FOREIGN PATENT DOCUMENTS

CN          1359492 A      7/2002
CN     101571829 A     11/2009
(Continued)

OTHER PUBLICATIONS

Michael Smith et al., "A Test-oriented Embedded System Production Methodology" Journal of Signal Processing Systems; For Signal, Image, and VideoTechnology, Springer US, Boston, vol. 56, No. 1, pp. 69-89, XP019690524, ISSN: 193908115 abstract figure 1 (Sep. 23, 2008).

(Continued)

*Primary Examiner* — Yoshihisa Ishizuka
(74) *Attorney, Agent, or Firm* — White & Case LLP

(57) ABSTRACT

A system and method are provided for testing features of an embedded system. The system includes a low-powered computing device communicatively coupled to a control application interface, a sensor interface, and a robotic interface. The low-powered computing device may receive sensor signals generated during a test, provide sensor data corresponding to the sensor signals, receive commands for the test, and provide instructions for movement of a robotic handler corresponding to at least one of the commands for the test. The system also includes a computing device communicatively coupled to the control application interface, an image processing interface, and a database interface. The computing device may receive sensor data, receive image data corresponding to images of the embedded system captured during the test, receive tests capable of being performed, and provide commands for the test.

24 Claims, 12 Drawing Sheets

(51) Int. Cl.
*G01R 31/28* (2006.01)
*G01R 31/319* (2006.01)

(52) U.S. Cl.
CPC ... *G01R 31/2846* (2013.01); *G01R 31/31907* (2013.01); *G01R 31/31908* (2013.01); *G06F 11/2205* (2013.01); *G06F 11/2635* (2013.01)

(58) Field of Classification Search
CPC .......... G01R 31/31908; G06F 11/2635; G06F 11/2273; G06F 11/2205
See application file for complete search history.

(56) References Cited

U.S. PATENT DOCUMENTS

| | | |
|---|---|---|
| 2009/0279673 A1 | 11/2009 | Maffre et al. |
| 2010/0011340 A1 | 1/2010 | Pandey |
| 2011/0246827 A1 | 10/2011 | Lin |
| 2013/0127904 A1 | 5/2013 | Dove et al. |
| 2013/0227348 A1* | 8/2013 | Stephenson ........... G06F 3/0488 714/27 |
| 2014/0006860 A1 | 1/2014 | Grey |
| 2014/0047417 A1 | 2/2014 | Kaasila et al. |
| 2015/0057961 A1 | 2/2015 | Montoya et al. |
| 2016/0059419 A1 | 3/2016 | Suzuki |
| 2016/0070550 A1 | 3/2016 | Van Eijndhoven et al. |
| 2016/0202310 A1 | 7/2016 | Nawrocki |

FOREIGN PATENT DOCUMENTS

| | | |
|---|---|---|
| CN | 101833498 A | 9/2010 |
| CN | 102316129 A | 1/2012 |
| CN | 103793323 A | 5/2014 |
| EP | 2725493 A1 | 4/2014 |
| JP | 2015-191366 A | 11/2015 |
| JP | 2016-014558 A | 1/2016 |
| JP | 2016-052695 A | 4/2016 |
| KR | 10-2006-0126839 A | 12/2006 |
| KR | 10201501144251 | 12/2015 |
| RU | 2435169 C1 | 11/2011 |
| WO | 2005/085888 A1 | 9/2005 |
| WO | 2005/085973 A1 | 9/2005 |
| WO | 2010-140883 A2 | 12/2010 |
| WO | 2012044262 A1 | 4/2012 |
| WO | 2014068368 A1 | 5/2014 |
| WO | 2016166555 A1 | 10/2016 |

OTHER PUBLICATIONS

Rajeev Alur et al., "Hierarchical Modeling and Analysis of Embedded Systems", Proceedings of the IEEE, IEEE, New York, US, vol. 91, No. 1, XP011065094, ISSN: 0018-9219 whole document (Jan. 1, 2003).

David Macii et al., "Tutorial 14: multisensor data fusion", IEEE Instrumentation & Measurement Magazine, IEEE Service Center, Piscataway, NJ, US, vol. 11, No. 3, XP011215847, ISSN: 1094-6969, pp. 24-33 (Jun. 1, 2008).

Artem Katasonov et al., "Smart Semantic Middleware for the Internet of Things", Proceedings of the Fifth International Conference on Informatics in Control, Automation and Robotics, XP055368451, ISBN: 978-989-8111-30-2, pp. 169-178 (May 11, 2008).

Estivill-Castro Vladimir et al., "Modelling, Validation, and Continuous Integration of Software Behaviours for Embedded Systems", IEEE European Modelling Symposium (EMS), IEEE, XP032973440, DOI: 10.1109/EMS.2015.24, pp. 89-95, (Oct. 6, 2015).

Mefenza Michael et al., "A framework for rapid prototyping of embedded vision applications", Proceedings of the 2014 Conference on Design and Architectures for Signal and Image Processing, European Electronic Chips & Systems Design Initiat, XP03278110, DOI: 10.1109/DASIP.2014.7115621, pp. 1-8, (Oct. 8, 2014).

Simon D et al., "Synchronous composition of discretized control actions: design, verification and implementation with ORCCAD", Real-Time Computing Systems and Applications, RTCSA '99 Sixth International Conference on Hong Kong, China, Los Alamitos, CA USA, IEEE Comput. SOC, US, XP010365362, DOI: 10.1109/RTCSA.1999.811210 ISBN: 978-0-7695-0306-6, pp. 158-165 (Dec. 13, 1999).

Notification of Transmittal of the International Search Report and the Written Opinion of the International Searching Authority, or the Declaration (8 pages) dated Feb. 8, 2018.

Written Opinion of the International Searching Authority (PCT Rule 43bis. 1), (10 pages), dated Feb. 8, 2018.

* cited by examiner

| | |
|---|---|
| 1 | Given User exists in SafeQ |
| 2 | And User has assigned PIN |
| 3 | And User has jobs in secure queue |
| 4 | And Robot is ready to operate |
| 5 | When User is authenticated with PIN |
| 6 | And Jobs are printed |
| 7 | And User is logged out |
| 8 | Then Job has status printed |

FIG. 11

UNIVERSAL AUTOMATED TESTING OF EMBEDDED SYSTEMS

CROSS-REFERENCE TO RELATED APPLICATIONS

This application is based upon and claims the benefit of priority from U.S. Provisional Application No. 62/410,666, filed Oct. 20, 2016, the entire contents of which are incorporated herein by reference.

FIELD OF THE INVENTION

This invention generally relates to systems and methods for verifying and validating stakeholder expected value of devices by universal automated testing of embedded systems.

BACKGROUND OF THE INVENTION

Modern products for consumer, commercial, or industrial use may have logic, functionality, or workflow implemented using software, hardware, or some combination of the two. One type of product, also known as an embedded system, ordinarily involves a combination of software and hardware and generally has a dedicated purpose to serve in the context of a greater whole. Embedded systems may be fixed in function or programmable. There is a large variety of embedded systems, including components that operate independently, packages that require specialized environments in which to operate, and modules that can interoperate with software or hardware meeting certain communication standards or design tolerances.

Verification of correct behavior and validation of stakeholder values (hereby jointly referred to as tests or testing) is an important step in the design and manufacture of embedded systems described above. There are many different categories of tests, including stress tests, performance tests, usability tests, compatibility tests, and functional tests, among others. Many of the tests in these categories evaluate the internals of the product being tested, such as the specific manner in which the product handles certain tasks. To develop such tests therefore requires knowledge of product internals, and to conduct such tests requires access to product internals.

In contrast, one type of testing known as "black-box testing" or "behavioral testing" is a way to test that typically does not require knowledge of or access to product internals. Instead, the product is treated as a "black box" and the test evaluates how the product functions from an outside perspective. Black-box tests may consider things such as the behavior of the product, or outputs generated by the product, in response to various inputs (or the lack thereof). As it is externally focused, black-box testing therefore tends to be more closely aligned to the experience of actually using the product.

In general, product testing can be manual or automated. Automated testing can result in fewer mistakes and significantly more thorough documentation. Automated testing can also be advantageous for consistently handing repetitive or otherwise high-volume tests that need to run over a lengthy period of time or a large number of devices. As an example, automated testing is widely used in the software industry to test consumer software in a variety of situations and across different platforms. In these automated tests, software companies generally run special tools on computers to simulate user activity with respect to a particular program, and then determine if the program is behaving correctly in response to the simulated activity.

It is more complicated to simulate user activity with respect to other kinds of products like embedded systems in consumer electronics, appliances, or even vehicles. Some of these systems may offer special connectivity for testing and expose internal processes through some type of interface to enable the simulation of user actions, but testing on such systems can be cumbersome and expensive as every test must be specifically designed and customized for each interface. A further issue is that other embedded systems do not provide this kind of test interface, and instead only provide an interface for use by an end user.

Therefore, there is a long-felt need for an automated test platform that is universal, flexible, and powerful enough to conduct tests of embedded systems (of various types to verify correct behavior and validate stakeholder values, including black-box testing) from different vendors by interacting with the interfaces provided on each system. Moreover, there is a long-felt need for an automated test platform that does not require expensive industry robotics equipment, other types of expensive hardware, or space to house large pieces of equipment. There is a long-felt need for an automated test platform that is optimized for office use and affordable to use for testing purposes, including simultaneous testing of multiple devices.

At the same time, the automated test platform needs to provide precise measurement of testing, including for example timing data related to the occurrence of certain actions or reactions. The automated test platform needs to be capable of providing highly relevant testing results by, for example, performing end-to-end testing of all components that would ordinarily be involved in a genuine user interaction. Finally, the automated test platform needs the flexibility to permit the creation of tests using simple, structured language suitable for a person without specialized training to read and understand rather than complex computer code.

BRIEF DESCRIPTION OF THE FIGURES

FIG. 11 is a sample test that can be run in an automated testing platform, according to one embodiment of the invention.

SUMMARY

Figure 1:
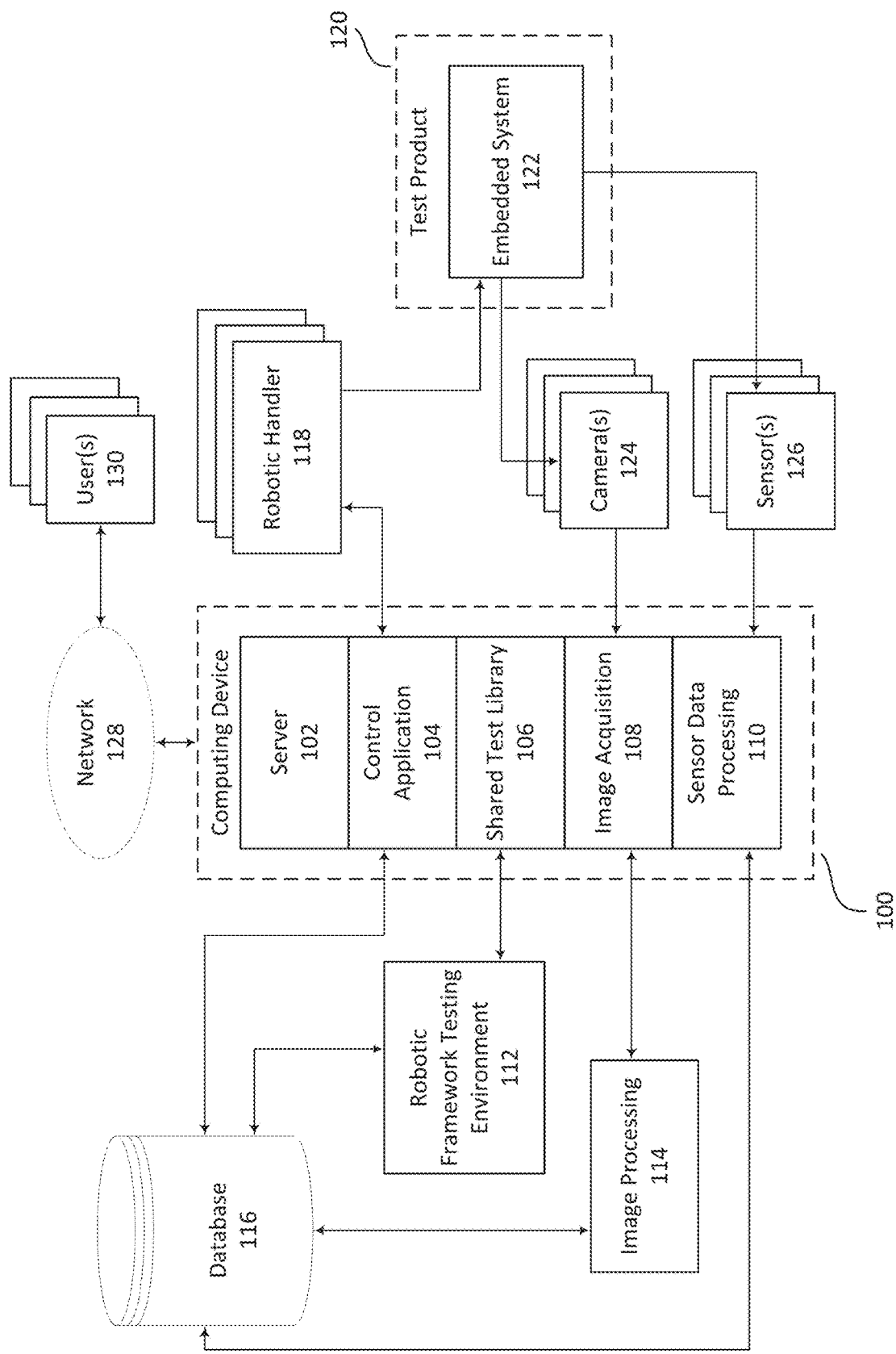
FIG. 1 is a block diagram of an automated testing platform, according to one embodiment of the invention.

In one embodiment of the invention, a system for testing a feature of an embedded system includes a low-powered computing device communicatively coupled to a control application interface, a sensor interface, and a robotic interface. The low-powered computing device is configured to receive from the sensor interface a plurality of sensor signals generated during a test of the feature of the embedded system, provide over the control application interface sensor data corresponding to the plurality of sensor signals, receive over the control application interface a plurality of commands for the test of the feature, and provide over the robotic interface a plurality of instructions for movement of a robotic handler corresponding to at least one of the plurality of commands for the test of the feature. The system for testing a feature of an embedded system also includes a computing device communicatively coupled to the control application interface, an image processing interface, and a database interface. The computing device is configured to receive from the control application interface the sensor data, receive from the image processing interface image data corresponding to a plurality of images of the embedded system captured during the test of the feature, receive from the database interface a plurality of tests capable of being performed on the feature, and provide over the control application interface a plurality of commands for the test of the feature.

In one embodiment, the computing device is connected to a network, and is configured to transmit status data of a test and a robotic handler to a user over the network. In one embodiment, the computing device is configured to communicate with a user over the network and permit the use or modification of an application running on the computing device by the user.

In one embodiment, the low-powered computing component is configured to process the sensor signals prior to providing the sensor data over the control application interface. In one embodiment, the low-powered computing component is configured to process the plurality of commands prior to providing the plurality of instructions over the robotic interface. In one embodiment, the computing device is communicatively coupled to a sensor data processing interface, and the computing device receives over the sensor data processing interface processed sensor data corresponding to sensor data captured during the test of the feature. In one embodiment, at least one of the low-powered computing device and the computing device is configured to be synchronized at an application level to the same reference time as another computing device.

In one embodiment, at least one of the plurality of tests comprises a plurality of keywords, and the computing device is configured to translate the keywords into commands capable of being performed by the robotic handler. In one embodiment, at least one of the plurality of tests comprises a plurality of keywords, and the computing device is configured to translate the keywords into commands for transmission over an interface.

In one embodiment, the sensor data or image data correspond to three-dimensional (3D) aspects of the embedded system or a test product of which the embedded system is a part. In one embodiment, the feature for testing is a two-dimensional (2D) feature.

In one embodiment of the invention, a method for testing a feature of an embedded system performed by a low-powered computing device and a computing device includes the steps of receiving from a sensor interface, by the low-powered computing device, a plurality of sensor signals generated during a test of the feature of the embedded system; providing over a control application interface, by the low-powered computing device, sensor data corresponding to the plurality of sensor signals; receiving from a control application interface, by the low-powered computing device, a plurality of commands for the test of the feature; providing over a robotic interface, by the lower-powered computing device, a plurality of instructions for movement of a robotic handler corresponding to at least one of the plurality of commands for the test of the feature; and receiving from the control application interface, by the computing device, the sensor data; receiving from an image processing interface, by the computing device, image data corresponding to a plurality of images of the embedded system captured during the test of the feature; receiving from a database interface, by the computing device, a plurality of tests capable of being performed on the feature; and providing over the control application interface, by the computing device, a plurality of commands for the test of the feature.

In one embodiment, the computing device is connected to a network, wherein the computing device is configured to transmit status data of the test and the robotic handler to a user over the network. In one embodiment, the computing device communicates with a user over the network, receives requests for the use or modification of an application running on the computing device, and processes the requests.

In one embodiment, the low-powered computing component processes the sensor signals prior to providing the sensor data over the control application interface. In one embodiment, the low-powered computing component processes the plurality of commands prior to providing the plurality of instructions over the robotic interface. In one embodiment, the computing device is communicatively coupled to a sensor data processing interface, and the computing device receives over the sensor data processing interface processed sensor data corresponding to sensor data captured during the test of the feature. In one embodiment, at least one of the low-powered computing device and the computing device synchronizes to the same reference time as another computing device, at an application level.

In one embodiment, at least one of the plurality of tests comprises a plurality of keywords, and the computing device translates the keywords into commands capable of being performed by the robotic handler. In one embodiment, at least one of the plurality of tests comprises a plurality of keywords, and the computing device is configured to translate the keywords into commands for transmission over an interface.

In one embodiment, the sensor data or image data correspond to three-dimensional (3D) aspects of the embedded system or a test product of which the embedded system is a part. In one embodiment, the feature tested is a two-dimensional (2D) feature.

DETAILED DESCRIPTION OF THE INVENTION

FIG. 1 is a block diagram of an automated testing platform, according to one embodiment of the invention, and shows how each portion of the platform is connected to the other portions. As shown in FIG. 1, control application 104 runs on computing device 100, and communicates with database 116. Computing device 100 may be any device that can run a control application, such as a personal computer (PC), server, laptop, smartphone, tablet, and the like. Computing device 100 will ordinarily comprise a processor in communication with volatile and/or non-volatile memory, a peripheral interface, and a network interface with which it connects to other components of the automated testing platform such as database 116 and robotic handler 118. The peripheral interface connects the computing device to various input devices which may include a keyboard, a mouse, a touchscreen, VR input mechanisms which may correspond to a robotic handler's position in 3D space, or any other suitable device to input local user commands to control computing device 100. It should be understood that computing device 100 and/or control application 104 may comprise specialized hardware (or could be an embedded system) tailored to operate as part of the automated testing platform. Such specialization could enhance the speed and response of the testing process. For example, specialized hardware within computing device 100 could include multiple computing components connected together via some communication path, such as a set of interfaces. For example, a low-powered computing component, e.g., consuming less than 25 watts, could be connected to the robotic handler 118 over a robotic interface and/or sensor(s) 126 over a sensor interface, while also connected to other computing components supporting, serving, or executing modules in the computing device 100 over a control application interface. Additionally, multiple such low-powered computing components could connect to the same shared computing components supporting, serving, or executing modules in the computing device 100 over a shared or individual control application interface. Low-powered computing components may provide a resource-saving and scalability advantage over other types of computing components. Note that low-powered computing component need not mean "low capability" computing component. For instance, it is possible to increase the computational power of a low-powered computing component with a targeted purpose by using specialized hardware such as dedicated circuitry for specific purposes (e.g. graphics processing). It should also be understood that there could be multiple computing devices and multiple control applications, or multiple computing devices sharing processing of one or more control applications. Additionally, there can be a library or service permitting the packaging and deployment of software updates across the multiple computing devices and control applications for consistency. Such a library or service would permit users to maintain different versions of software and update those versions in a central location.

Control application 104 works with shared test library module 106, image acquisition module 108, and sensor data processing module 110 to communicate with robotic handler 118. Shared test library module 106 works with robotic framework testing environment 112, which in turn works with database 116.

It should be understood that database 116 and robotic framework testing environment 112 could be separate from computing device 100 as in the embodiment shown in FIG. 1, and communicate over a database interface, or that database 116 and robotic framework testing environment 112 could be part of computing device 100 in other embodiments. Robotic handler 118 interacts with embedded system 122 of the product 120 being tested. Robotic handler 118 may accomplish the interaction via a user interface such as a two-dimensional (2D) feature of an embedded system. 2D features of embedded system include at least touchscreen interfaces, but it should be understood that 2D features may also refer to physical analogs of those touchscreens (e.g., buttons, dials, and sliders). It should be understood that interaction with touchscreen interfaces need not be limited to pressing buttons. Robotic handler 118 may also be capable of performing interactions such as those required to interact with the following types of user interfaces: (1) force-sensitive touchscreens capable of detecting different levels of pressure, (2) multi-touch touchscreen capable of detecting simultaneously activated points, or (3) touchscreens that detect gestures performed such as directional swipes or traced symbols. It should also be understood that there could be multiple robotic handlers controlled by one or more control applications. Moreover, there could be multiple embedded systems or products being tested by the one or more robotic handlers. In a situation involving multiple robotic handlers and/or multiple embedded systems or products being tested, there can be a robotic management system that coordinates the testing across all the devices. Such a robotic management system would permit multiple users to schedule the use of robotic handlers to avoid collisions. The robotic management system also enables the prioritization of tasks to permit orchestration of all the testing robotic handlers and/or devices consistent with a preference such as speed, coverage, resource cost minimization, or other measures of efficiency.

Shared test library module 106 may include or make accessible definitions of various procedures and methods for performing different aspects of each test. As one example, there could be a method for authentication using a PIN number, which includes steps to operate robotic handler 118 or other robotic handlers to interact with embedded system 122 by, for example, tapping buttons based on various flows defined in database 116 that result in the robotic handler navigating to the appropriate user interface and inputting a PIN number into embedded system 122. The method for authentication using a PIN number could also include steps of requesting feedback from other components of the testing platform such as image acquisition module 108 and sensor data processing module 110 so it can compare actual feedback to expected feedback and prepare an appropriate return value or update a condition for evaluation by the robotic framework testing environment 112.

Robotic framework testing environment 112 is an application that can manage robotic handler 118 or other robotic handlers. The robotic framework testing environment 112 is therefore aware of the status of any such robotic handlers in the system and other modules of the testing platform including without limitation image processing module 114 and camera(s) 124. The robotic framework testing environment is able to perform actions such as processing test requests, booking robotic handlers for running tests, and running tests. Robotic framework testing environment 112 may execute tests comprising a series of steps. Each step may correspond to keywords or keyphrases. Keywords or keyphrases may, for example, correspond to specific procedures or methods stored in, made accessible by, or defined in shared test library module 106. For instance, there could be a keyword or keyphrase "Authenticate with PIN" that refers to the specific procedure or method stored in, made accessible by, or defined in shared test library module 106 referenced in the previous paragraph. Robotic framework testing environment 112 may use the keyword or keyphrase to cause execution of the respective procedure or method of shared test library module 106 and receive a return value or evaluate a condition updated by the procedure or method. Upon receipt of such a value or evaluation of such a condition, robotic framework testing environment 112 may determine whether to stop execution or proceed to execute another test step.

Computing device 100 may be connected to a network 128. Network 128 may be any known communications network, including the Internet, a Local Area Network (LAN), a Wide Area Network (WAN), etc. A user or users 130 may connect via network 128 to computing device 100 via server 102 and operate control application 104. Through the connection, and using the control application, users can monitor the activity of robotic handlers and modify the software controlling them as well. Server 102 may be, for example, a Representational State Transfer ("REST") server for communication with user clients. Server 102 could also implement other mechanisms for service system architecture, including Common Object Request Broker Architecture ("CORBA"), Distributed Component Object Model ("DCOM"), Remote Procedure Calls ("RPC"), or Simple Object Access Protocol ("SOAP") for communication with user clients.

In one embodiment where multiple users share a single automated testing platform, users may "book" the use of robotic handlers to avoid collisions resulting from simultaneous, possibly conflicting requests from different users. Users may also "unbook" the robotic handler after completing a test or after determining that the robotic handler is no longer needed. However, it should be understood that users may accidentally leave a robotic handler in a "booked" state, preventing other users from engaging the robotic handler. In such a case, the robotic handler may "unbook" itself after a certain period of inactivity so it becomes available to other users.

Camera 124, as a specific version of a visual sensor (see general description of sensors below), observes the embedded system 122 or other portions of test product 120, including 2D features or 3D aspects of the embedded system 122 or test product 120, and communicates with the image acquisition module 108. By way of example, the observation of 3D aspects by camera 124 may result in image data reflecting mechanical aspects of how the embedded system 122 or test product 120 respond during a test of a 2D feature of the embedded system 122. Image acquisition module 108 in turn works with image processing module 114, which further communicates with database 116. It should be understood that image processing module 114 could be separate from computing device 100 as in the embodiment shown in FIG. 1, and communicate over an image processing interface, or that image processing module 114 could be part of computing device 100 in other embodiments. It should also be understood there could be multiple cameras 124 observing embedded system 122 or other portions of test product 120.

In a similar fashion, sensor 126 observes the embedded system 122 or other portions of test product 120, including 2D features or 3D aspects of the embedded system 122 or test product 120, and communicates with sensor data processing module 110. By way of example, the observation of 3D aspects by sensor 126 may result in sensor signals reflecting mechanical aspects of how the embedded system 122 or test product 120 respond during a test of a 2D feature of the embedded system 122. Sensor data processing module 110 receives the sensor signals and performs any processing if necessary to generate sensor data. Some sensor signals, e.g. those provided by sensors detecting a binary condition or providing a numeric value, may constitute sensor data without any further processing depending on the test for which the sensor data is to be interpreted. Sensor data processing module 110 communicates with database 116 and provides data to control application 104 so it can interpret the sensor data in a manner corresponding to the test product. Sensor 126 could be a light sensor, visual sensor, temperature sensor, humidity sensor, motion sensor, mechanical sensor, pressure sensor, audio sensor, or any other sensor appropriate to the specific characteristics of the embedded system or test product being evaluated. For instance, in an embodiment where the test product is a multi-function printing device and the test involves verifying certain characteristics of the printed output, sensor 126 could be an optical/mechanical sensor to detect the presence of paper, whether the printed paper is duplex or single, the size of the paper, the weight of the paper, black levels of the printout, or colors of the printout, among other aspects of printed output that may need verification. In another embodiment where the test product is a 3D printer, sensor 126 could be a temperature or humidity sensor to evaluate the conditions of the printing chamber or an optical sensor to evaluate the progress of the printing. In another embodiment where the test product includes physical switches or other pressure-sensitive inputs, sensor 126 could be a haptic sensor evaluating the force necessary to activate such switches or inputs. It should be understood that different embodiments may operate with more than one sensor 126. For example, in an embodiment where the test product is a washing machine, a first sensor could be a temperature sensor to evaluate the water temperature, and a second sensor could be a microphone to evaluate the level of noise during operation. Additionally, in some embodiments, sensor 126 could be connected to a local computing device, which may be a low-powered computing device, such as a Raspberry Pi™ microcomputer, that processes input locally prior to transmission to computing device 100. The local computing device, which may be a low-powered computing device, may perform processing of signals received from sensor 126 to generate sensor data. In such embodiments the function of sensor data processing module 110 could be streamlined or even eliminated.

Figure 2:
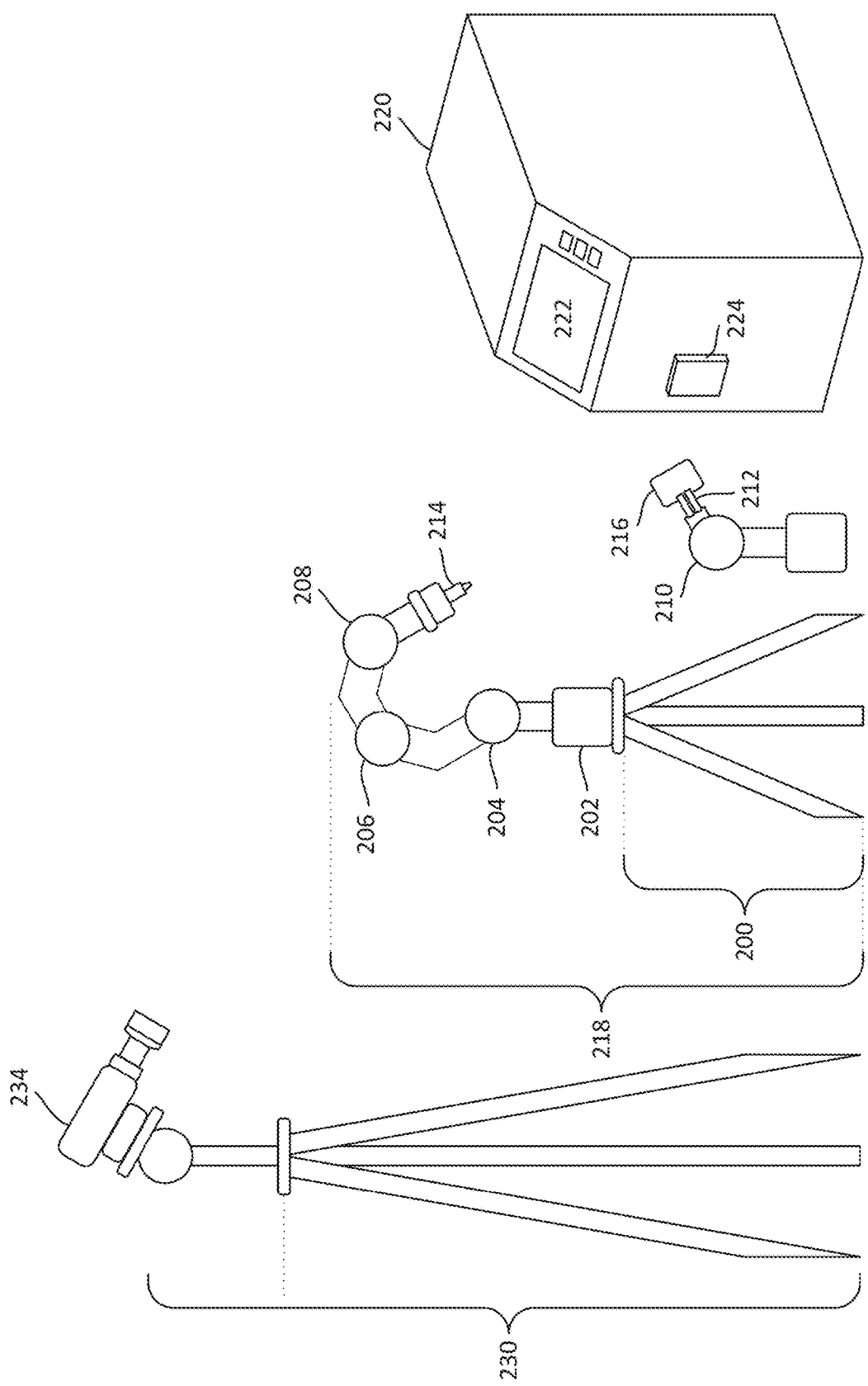
FIG. 2 is a diagram of the components of a robotic handler for use in an automated testing platform, according to one embodiment of the invention.

Robotic handler 118 of FIG. 1 may comprise various components. FIG. 2 is a diagram illustrating the components of an exemplary robotic handler 218 in the physical test environment according to one embodiment of the invention. In some embodiments, the robotic handler 218 can be used as the robotic handler 118 shown and described in connection with FIG. 1. Robotic handler 218 comprises at least one manipulation device 214 which is driven by one or more servomotors 202, 204, 206, and 208. The number of servomotors is not restricted to four and could be more or less. The nature of manipulation device 214 depends on the desired interaction with embedded system 222 or test product 220. When embedded system 222 is a touch screen, for instance, manipulation device 214 may be a stylus suitable for depressing on-screen buttons. When embedded system 222 is a display with physical buttons, for instance, manipulation device 214 may be a stylus suitable for depressing physical buttons. If embedded system 222 includes a touch screen in addition to physical buttons, manipulation device 214 may be a stylus or styluses capable of depressing both on-screen and physical buttons. When embedded system 222 contains other methods of interaction, such as dials, manipulation device 214 may be a gripper suitable for rotating dials. In other embodiments, manipulation device 214 may include multiple styluses, tools, or attachments from which it can select an appropriate one for the desired interaction with embedded system 222. Camera 234 may be mounted on adjustable tripod 230 at an appropriate distance, height, and angle to observe the embedded system 222 or other portions of test product 220. While not illustrated in FIG. 2, it should be understood that there could be test environments in which multiple cameras are used.

Robotic handler 218 also includes a positioning device 200, such as an adjustable stand, to ensure it is correctly positioned to interact with the embedded system 222 and test product 220. Moreover, there could be one or more auxiliary servomotors such as servomotor 210, which may have a specialized task that can be done independently of the manipulation device. For example, servomotor 210 could be configured with hardware 212 permitting it to submit an access card or other certification device 216 for verification by reader 224 on test product 220. The access card or certification device may be a single card or device, or an emulator that can represent the account information of any other card or device, to remove the need to exchange cards or devices to test different user accounts. The auxiliary servomotor is optional and could be replaced by other auxiliary devices that need not perform physical actions. For example, the certification device 216 could interface with embedded system 222 or reader 224 through other means including via direct electronic link, removing the need for a servomotor 210 to perform a physical action.

In one embodiment, when robotic handler 218 experiences a pre-defined but configurable period of inactivity, e.g. five minutes, the manipulator may move to a specific resting position and turn off servomotors 202, 204, 206, and 208. This lowers the load of servomotors during such pauses and increases their lifetime. Upon receiving a new command, the robotic handler 218 wakes up from resting and turns its servomotors back on to execute the command.

Figure 3:
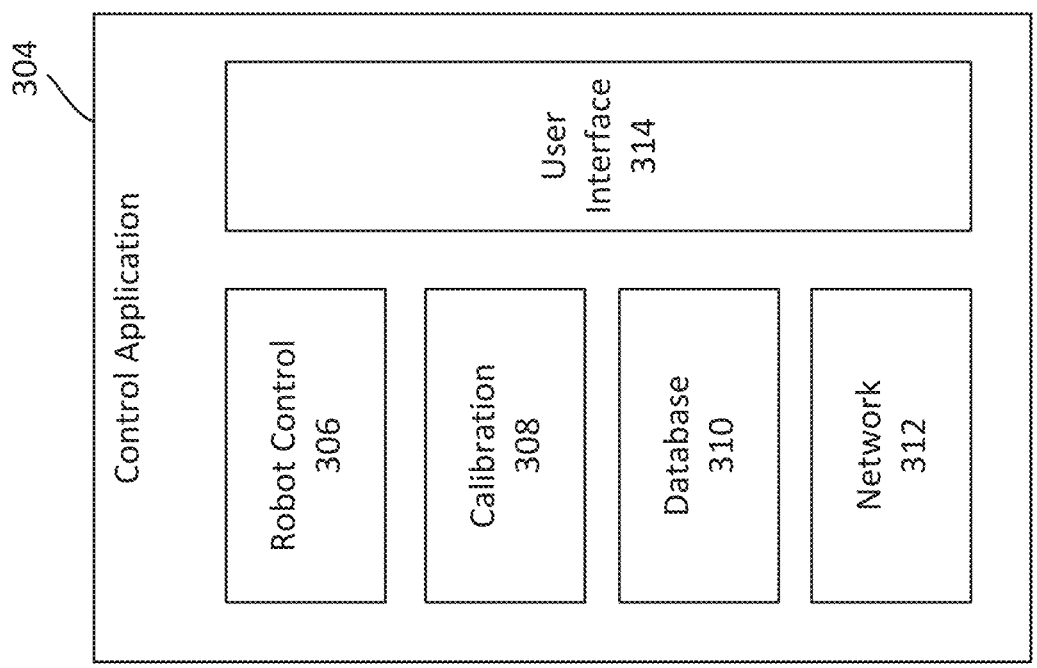
FIG. 3 is a block diagram of the components of a control application for use in an automated testing platform, according to one embodiment of the invention.

FIG. 3 is a block diagram of the components of control application 304 according to one embodiment of the invention. In some embodiments, control application 304 may be used as the control application 104 shown and described in connection with FIG. 1. Robot control module 306 governs the connectivity to and general control of a robotic handler such as 118 or 218 shown and described in connection with FIGS. 1 and 2, respectively. Calibration module 308 may be used to calibrate the robotic handler, a camera such as 124 shown and described in connection with FIG. 1, or a sensor such as 126 shown and described in connection with FIG. 1. Database module 310 manages the information and structure of a database, such as database 116 shown and described in connection with FIG. 1. Database module 310 may include user interfaces or other tools to modify the information and/or structure of the database. For example, a user interface may provide the ability to update different types of input fields or other UI components in the database or enter new instances of existing types. Finally, network module 312 manages connections to a server, such as server 102 shown and described in connection with FIG. 1, and a shared test library module, such as shared test library module 106 shown and described in connection with FIG. 1. These components are all exposed to an end user via user interface 314, a possible instance of which is illustrated in FIG. 5.

Figure 4:
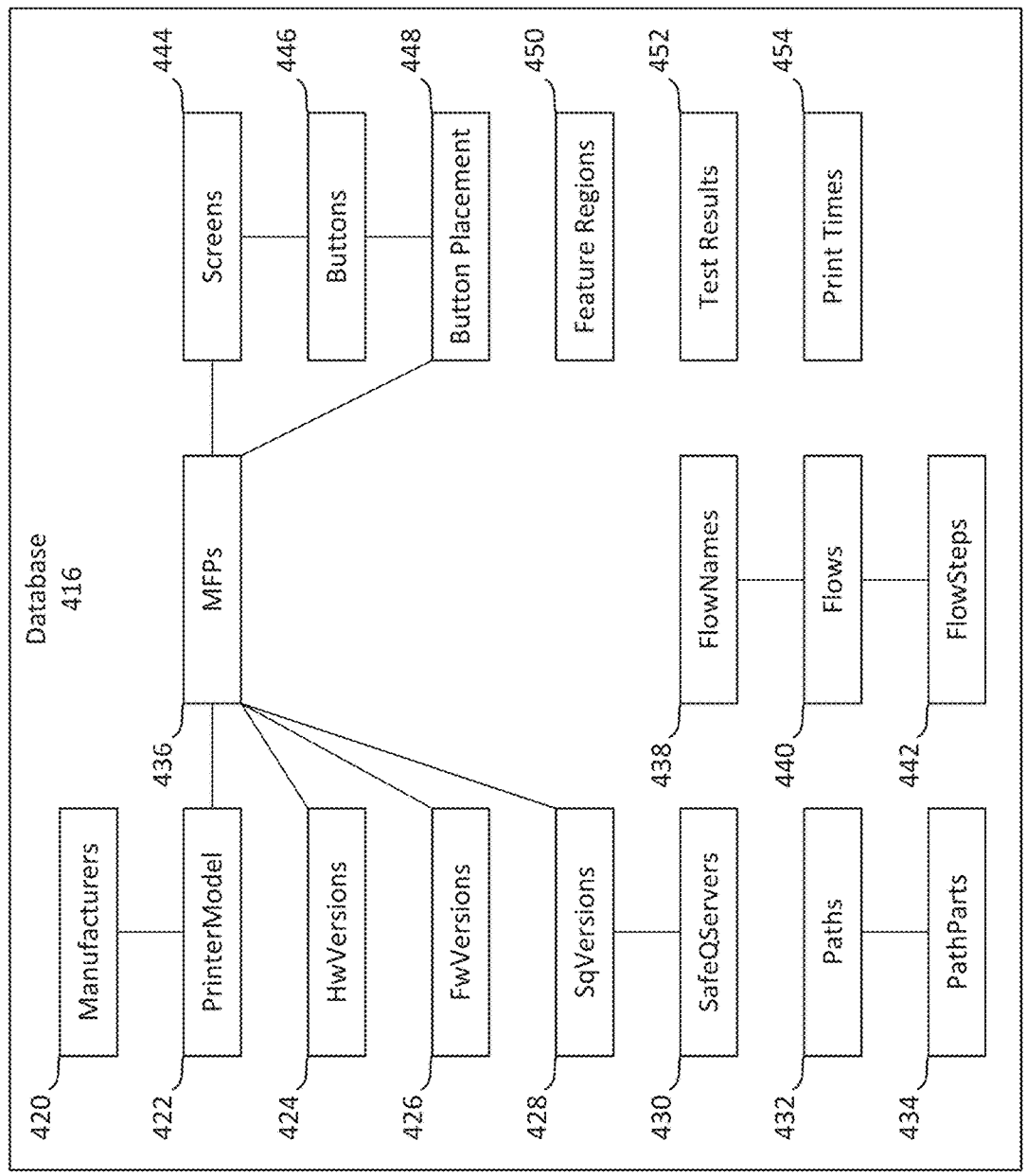
FIG. 4 is a diagram of an exemplary schema for a database for use in an automated testing platform, according to one embodiment of the invention.

FIG. 4 is a block diagram of an exemplary schema for a database 416 in an automated testing platform, according to one embodiment of the invention. In some embodiments, database 416 may be used as the database 116 shown and described in connection with FIG. 1. "Manufacturers" table 420 includes information about each manufacturer. "PrinterModels" table 422 includes definitions of manufacturer and model. "HwVersions" table 424 includes entries corresponding to the versions of hardware used in a printer model. "FwVersions" table 426 includes entries corresponding to the versions of firmware used in a printer model. "SqVersions" table 428 includes entries corresponding to the versions of a print manager server used with a printer model. An exemplary implementation of a print manager server may be the YSoft SafeQ™ server. "SafeQServers" table 430 includes information for each print manager server, which again may be the YSoft SafeQ™ server in one embodiment. "Paths" table 432 defines constants for moving the robot. Such constants may include values specific to certain types of touch displays, for example, and without limitation, devices with capacitative and resistive touch displays. "PathParts" table 432 defines constants for speed and pauses of robot movements. "MFPs" (standing for multi-function printers or multi-function devices) table 436 includes definitions of a PrinterModel, print manager version, firmware version, hardware version, and screen size. "FlowNames" table 438 includes names of user-defined flows. Each user-defined flow may be implemented differently across different vendors and different devices. Accordingly, "Flows" table 440 defines user-defined flows for desired actions, including an identification of the name from "FlowNames," a particular vendor and/or device to which the flow is applicable, and corresponding entries in the "FlowSteps" table. "FlowSteps" table 442 includes definitions of steps that, as referenced by "Flows" table 440, describe a flow for a desired action. Each definition of a step may include a particular interface element with which to interact, the desired interaction, an order in a flow, and other related options for steps, which may for instance include the ability to skip verification of a destination screen for faster execution. "Screens" table 444 includes definitions of each screen in the interface of an embedded system, including for example a login screen and a main screen. "Buttons" table 446 defines text, a tag, destination screen, source screen, and whether a button is a hardware button. "Button Placement" table 448 includes definitions of MFPs, position, size, and buttons. "Feature Regions" table 450 includes definitions of areas on the screens which may, for example, be used by the image processing service. These definitions could include text regions, image regions, and other areas with specific purposes such as pop-up window regions or in which certain types of processing may be done, such as reading regions. "Test Results" table 452 includes definitions of the results of various tests performed, including definitions of test names; Internet Protocol or other network addresses; timing information such as start, end, and duration; outputs; formats; and ultimate results or conclusions from the tests. "Print Times" table 454 includes definitions of print jobs, including job sizes, job formats, device, and versioning information for print manager servers, which again may be the YSoft SafeQ™ server in one embodiment.

Figure 5A:
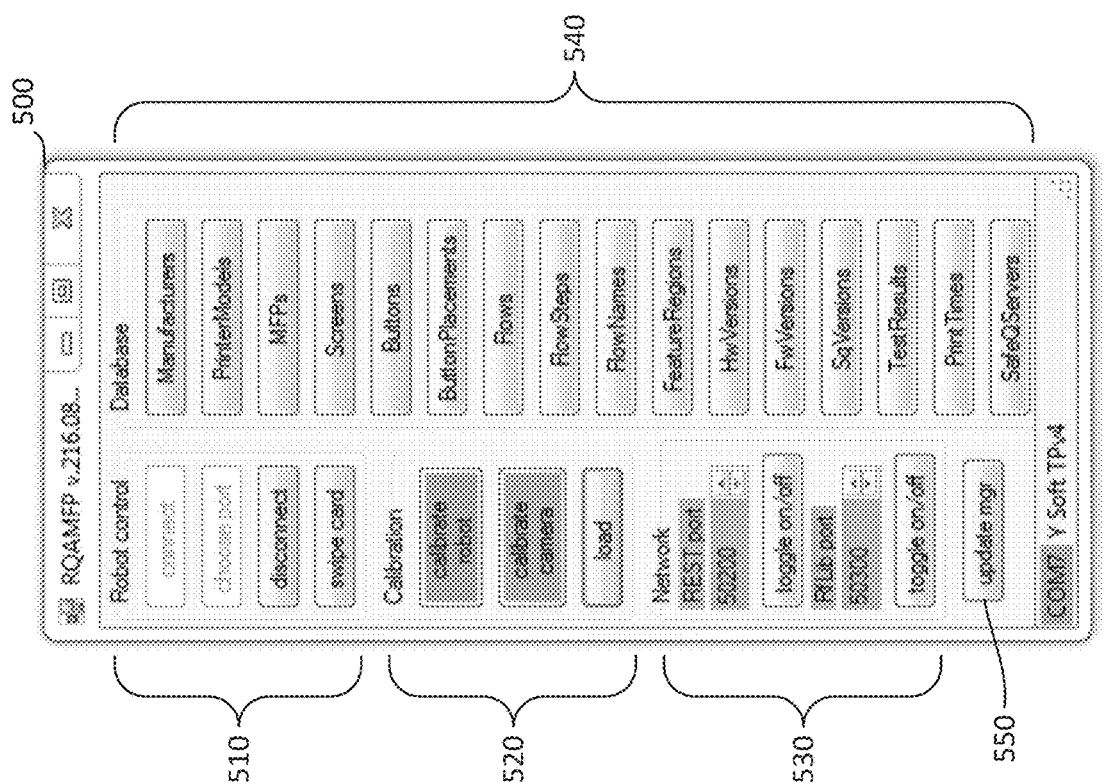
FIG. 5A is a screen image of an exemplary user interface to set up a control application, according to one embodiment of the invention.

FIG. 5A is a screen image of an exemplary user interface 500 for components of the control application of FIG. 3, according to one embodiment of the invention. As shown in this image, the robot control user interface 510 includes controls to connect to a robotic handler, such as to choose a network port for the connection, to disconnect from the robotic handler, and to control an auxiliary servomotor, such as to swipe a card at the test product. Though the button is labeled "swipe card" in this exemplary user interface, it should be understood a certification device could be linked to the embedded system 222 or reader 224 through other means that do not require a physical card swipe, as mentioned earlier. In such a scenario the "swipe card" button would activate the necessary certification process to obtain access to the test product. The calibration user interface 520 includes controls to calibrate a robot, to calibrate a camera, and to load a saved calibration. In brief, camera calibration ensures that the camera is in the best position for taking clear pictures, and may also provide a way for a user to configure a camera's properties (e.g. exposure settings such as shutter speed, ISO speed, and aperature). Robot calibration is described in further detail in conjunction with FIGS. 7-9. The network user interface 530 includes controls to indicate the port to which a REST server is responsive, to indicate the port to which a shared test library module is responsive, and controls to toggle the connections on and off. The database user interface 540 includes controls to manage each table described in the schema of FIG. 4. Control 550 permits updating the version of a control application stored on a server, and opens a dialog where a user may select and install a different version of a control application.

Note the lack of visible controls in this embodiment for "Paths" table 432 as shown and described in connection with FIG. 4, which defines constants for moving the robot corresponding to touch displays, and "PathParts" table 434 as shown and described in connection with FIG. 4, which defines constants for speed and pauses of robot movements. Ordinarily these tables need not be modified unless a new type or configuration of robotic handler is added to the testing platform. Other embodiments could include controls for these tables at the bottom, with a special note to take caution in modifying these tables, or with access control permitting modification only by certain users with the correct roles or permission levels.

Figure 5B:
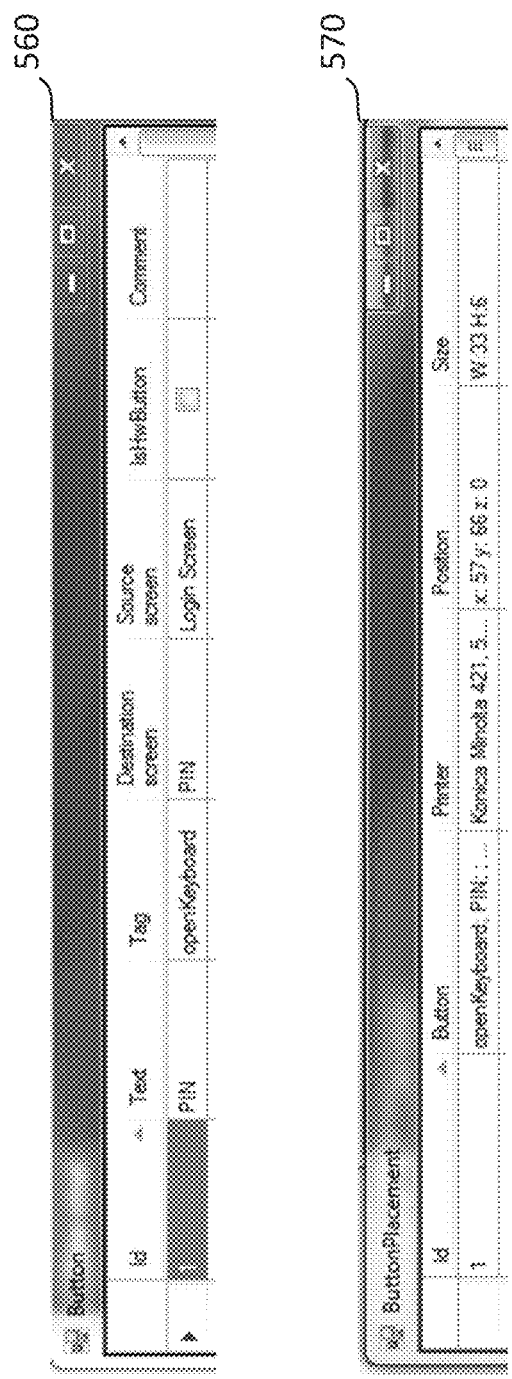
FIG. 5B is a screen image of exemplary user interface sub-screens that can be reached from the user interface of FIG. 5A, according to one embodiment of the invention.

FIG. 5B is a screen image of exemplary user interface sub-screens 560 and 570 that can be reached from the user interface of FIG. 5A to manage "Button" table 446 and "Button Placement" table 448 as shown and described in connection with FIG. 4, respectively, according to one embodiment of the invention. According to this embodiment, the "Buttons" table includes definitions for buttons in embedded systems on various test products. An example entry in the "Buttons" table could include Text: "PIN," Tag: "openKeyboard," Destination screen: "PIN," and Source screen: "Login screen." This would represent a button on an embedded system of a test product that shows on the login screen and, when pressed, opens a keyboard at the PIN screen so the user can enter a PIN. The "Button Placement" table can link a button defined in the "Buttons" table to a specific printer. An example entry in the "Button Placement" table for the button with Tag: "openKeyboard" could include Printer: "Konica Minolta 421," Position "x:57 y:66 z:0," and Size "W: 33, H: 6." This would indicate that, on the Konica Minolta™ 421 test product, an openKeyboard button can be found at the coordinates x:57, y:66, z:0 and the button is 33 mm wide and 6 mm high. In this embodiment, the coordinates are defined relative to x:0 y:0 z:0, which corresponds to the bottom left corner of the screen.

Figure 6:
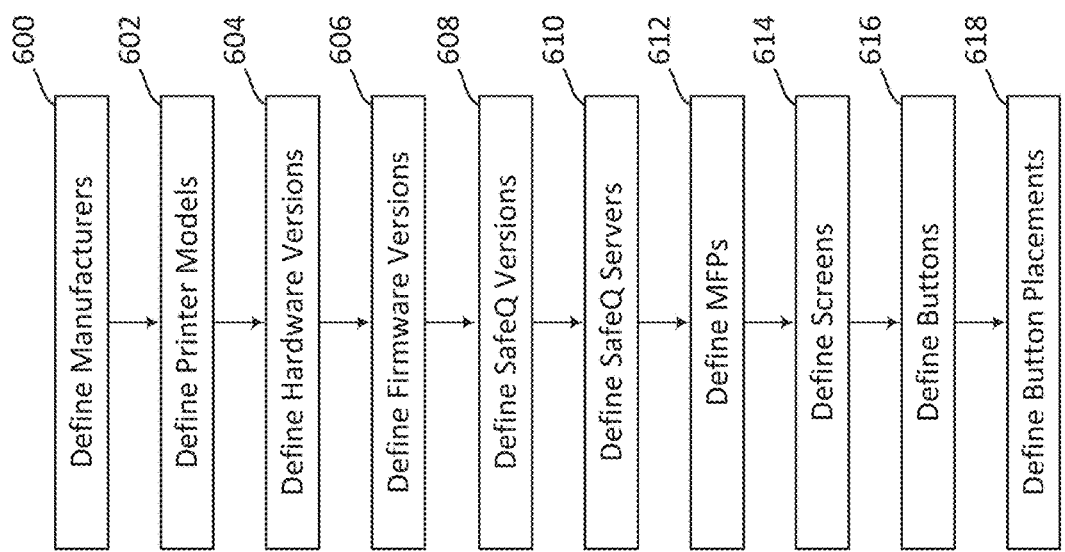
FIG. 6 is a flowchart of steps for creating a new definition of a product for testing in an automated testing platform, according to one embodiment of the invention.

FIG. 6 is a flowchart of steps for creating a new definition of a product in a database for testing, according to one embodiment of the invention. While other flows are possible, this exemplary flow ensures that all the data is populated in a manner consistent with the database schema in the embodiment of FIG. 4 and that prerequisite data is entered in certain tables before it is needed to populate other tables. Step 600 defines entries in the "Manufacturers" table to represent the manufacturers of the test products. Step 602 defines entries in the "PrinterModels" table which represent models of printers and associate them with their corresponding manufacturers. Step 604 defines entries in the "HwVersions" table which represents versions of hardware in the printer models. Step 606 defines entries in the "FwVersions" table which represents versions of firmware in the printer models. Step 608 defines entries in the "SqVersions" table which represent versions of print manager servers, such as YSoft SafeQ™ servers in one embodiment, for the printer models. Step 610 defines entries in the "SafeQServers" table which correspond to other information regarding the print manager servers that will be used to manage the printers. Step 612 defines entries in the "MFPs" table which include definitions of a printer model, print manager server version, firmware version, hardware version, and screen size. The reason Step 612 for defining MFP entries occurs where it does in the definition flow is that there may be different multi-function printers with the same model but different print manager server version, firmware version, or hardware version. Step 614 defines entries in the "Screens" table which represent the various screens on the interface of the embedded system in the test product. Step 616 defines entries in the "Buttons" table which represent the various buttons corresponding to each screen. Step 618 defines entries in the "Button Placement" table which represent the position and size of each button on a screen in each MFP.

In certain embodiments the flow to define a new product for testing may be performed manually, but it should be understood that a subset of the steps or even all steps may be assisted by helper applications or performed automatically as well. For example, in one embodiment with an automatic training function, the control application may use the robotic handler and camera to navigate the screens of an embedded system on a new test product by trying buttons and recording the results and navigational flow between screens. This will populate the database with information in the "Screens," "Buttons," and "Button Placement" tables, leaving it up to a person to name the screens appropriately at a later time.

Figure 7:
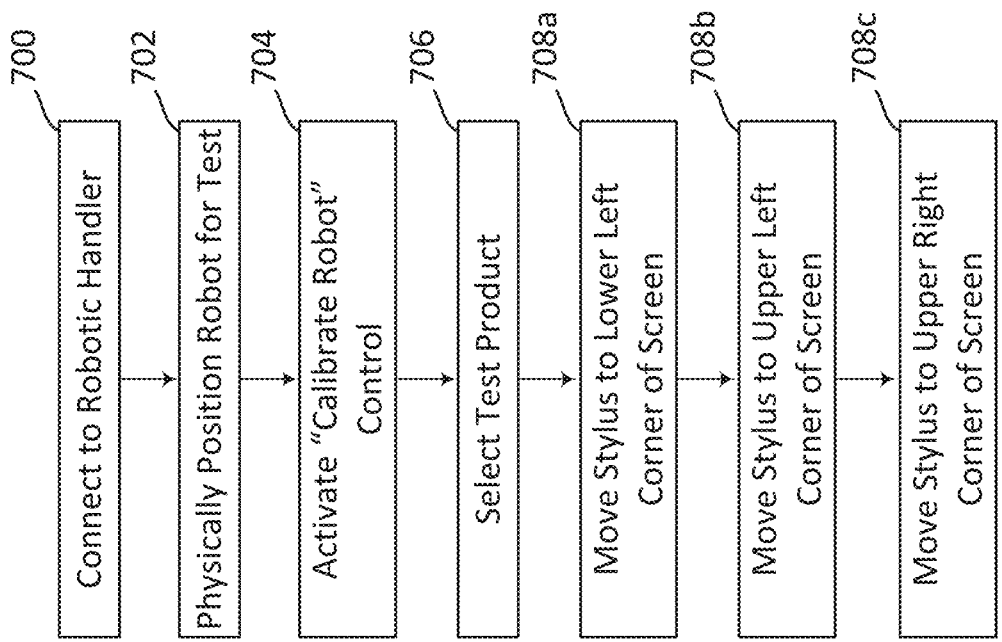
FIG. 7 is a flowchart of steps performed to calibrate a robot in an automated testing platform, according to one embodiment of the invention.

FIG. 7 is a flowchart of steps performed to calibrate a robotic handler such as 118 and 218 in the automated testing platform, according to one embodiment of the invention and consistent with the exemplary user interface as shown and described in connection with FIG. 5A. The purpose of calibration is to ensure the robotic handler knows where it is relative to the embedded system being tested. Calibration for a robotic handler may be basic or semi-automatic. The general process to start both basic and semi-automatic calibration methods is the same—identifying the three corners of the screen mapped in accordance with the flow of FIG. 7. However, while basic calibration only involves a single pass through the calibration flow, semi-automatic calibration continues onwards to an automatic re-calibration phase. In one embodiment, the calibration results may be verified by using a "try" functionality to have the robotic handler tap a selected button on the screen of the embedded system.

Step 700 is to ensure the robot is connected by using robot controls such as those corresponding to 510 in the exemplary user interface of FIG. 5A. Step 702 is to physically position the robot in front of the test product so it can reach elements on the screen of the embedded system and any hardware elements, such as buttons, that may be required for testing. Step 704 is to activate the "Calibrate Robot" control in the user interface, such as the button depicted in section 520 of the exemplary user interface of FIG. 5A. Step 706 is to select the test product, which should already have been created, for example in accordance with the flow of FIG. 6. The calibration interface provides a series of prompts on the screen for the user to follow. Step 708*a* is to navigate the robotic handler to the lower left corner of the screen. Step 708*b* is to navigate the robotic handler to the upper left corner of the screen. Step 708*c* is to navigate the robotic handler to the upper right corner of the screen.

Figure 8:
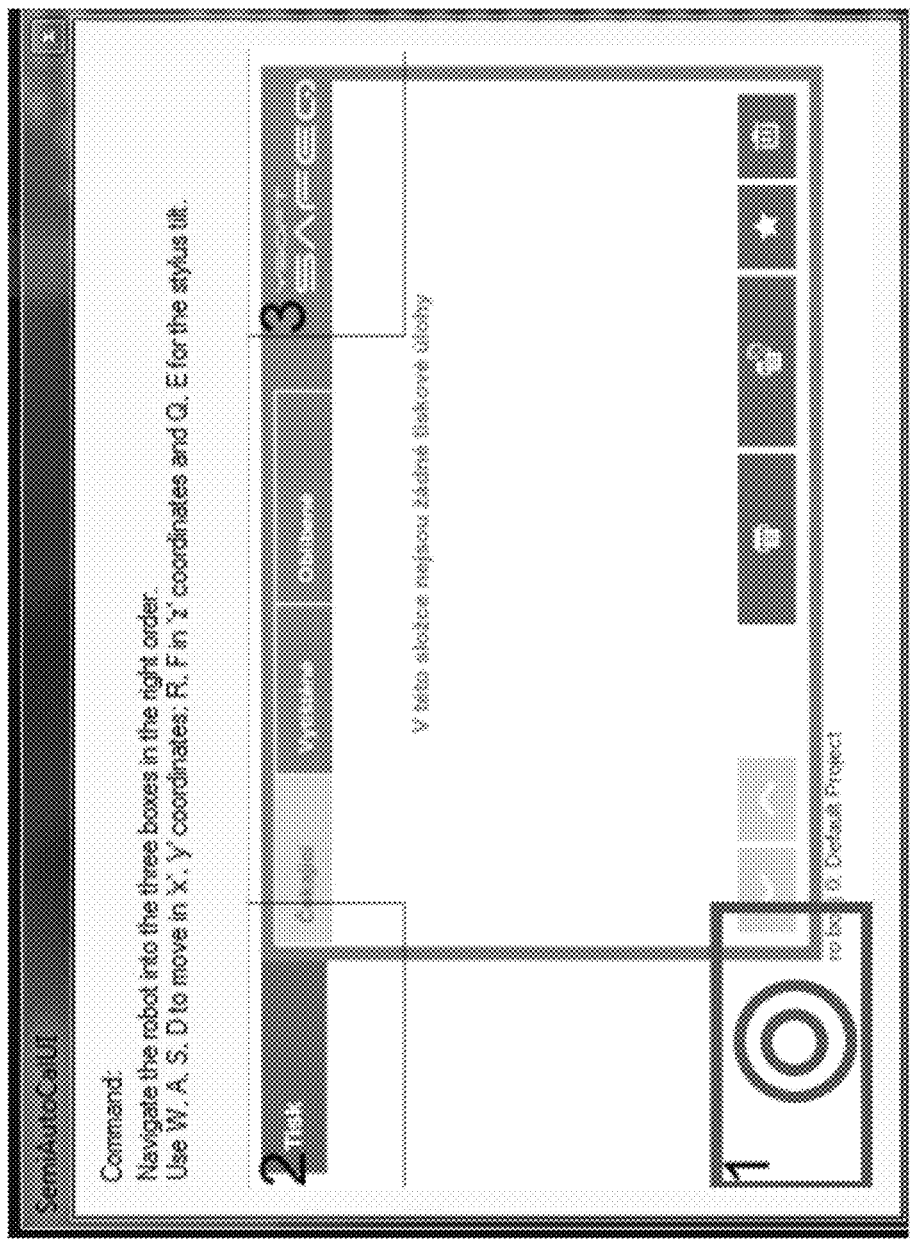
FIG. 8 is a screen image of an exemplary calibration user interface that can be reached from the user interface of FIG. 5A.

FIG. 8 is a screen image of an exemplary semi-automatic calibration user interface guiding a user through the initial manual calibration which parallels the steps for basic calibration. In this embodiment, the robotic handler is equipped with a stylus as a manipulation device and controlled via keyboard input. It should be understood that other manipulation devices could be used, and that other forms of control could be used as well, including manual positioning where possible for robotic handlers that can accept manual positioning inputs and derive servomotor angles using inverse kinematics.

Basic calibration ends here by saving the calibration results; the user interface provides a notification that the robotic handler has been calibrated for the test product. The calibration results consist of x, y, z coordinate values for the three corners of the screen mapped, which defines a plane in 3D space. In this embodiment, the coordinates are defined relative to x:0 y:0 z:0, which corresponds to center of the first servomotor in the robotic handler.

Figure 9:
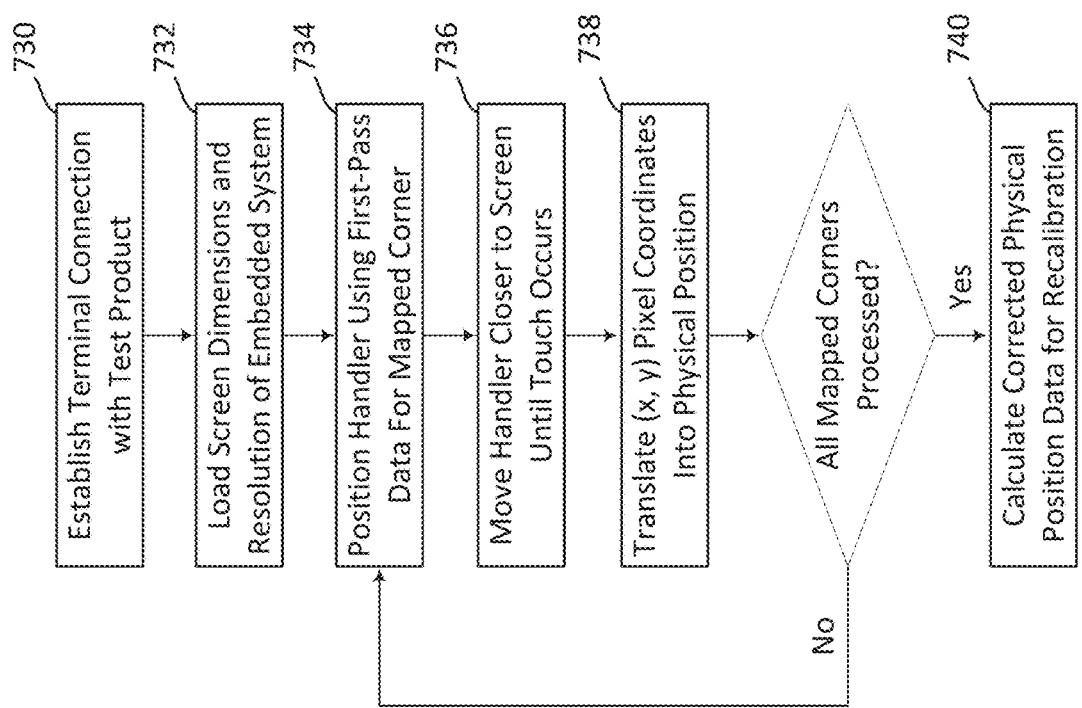
FIG. 9 is a flowchart of steps performed in a semi-automatic calibration method to conduct automatic recalibration of a robotic handler after an initial pass through the flow of FIG. 7, according to one embodiment of the invention.

As stated above, semi-automatic calibration involves running through the initial basic calibration process followed by an automatic recalibration phase. FIG. 9 is a flowchart of steps performed in a semi-automatic calibration method to conduct automatic recalibration of a robotic handler after an initial pass through the flow of FIG. 7, according to one embodiment of the invention. Step 730, which may be done before the flow of FIG. 7 as desired, is to set up the test product with a terminal connection to the control application which reports the (x, y) pixel coordinates of any detected tap on the screen of an embedded system. Step 732 is to load the control application with the screen dimensions and resolution of the screen of the embedded system, which can be used to translate any (x, y) pixel coordinate into an (x1, y1) position on the screen in millimeters. Step 734 is for the control application to use these sources of information to position the robotic handler using the data for the first mapped corner derived from the first pass through the semi-automatic calibration flow; rather than positioning the stylus exactly as mapped, the robotic handler initially starts further away from the screen (that is, slightly closer to its origin position). In step 736 the robotic handler moves closer to the screen until a touch is reported by the terminal connection. Step 738 processes the reported (x, y) pixel coordinates and translates it into a physical (x1, y1) position on the screen in millimeters. The automatic recalibration process repeats steps 734 through 738 for each of the three mapped corners. Then, step 740 uses the physical position data for the three mapped corners of the screen and, in conjunction with the reported (x, y) pixel coordinate data, recalculates the corrected physical (x, y, z) positions of the three mapped corners of the screen and replaces the previously recorded data in the first phase of the semi-automatic calibration process. This new set of data resulting from the automatic recalibration process removes user error and provides absolute precision to position the robotic handler relative to the screen of the embedded system on the test product.

Figure 10:
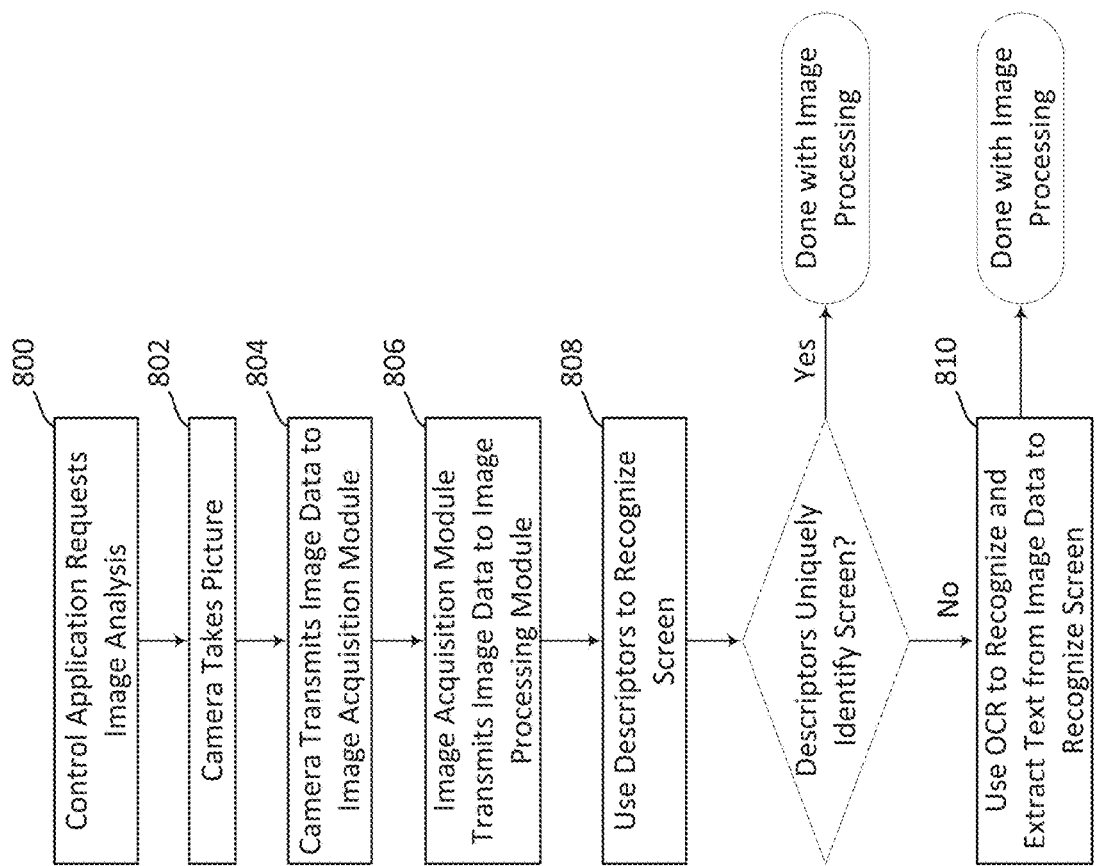
FIG. 10 is a flowchart of steps performed for image acquisition and processing in an automated testing platform, according to one embodiment of the invention.

FIG. 10 is a flowchart of steps performed for image acquisition and processing in an automated testing platform, according to one embodiment of the invention consistent with the system shown and described in connection with FIG. 1. The automated testing platform includes image acquisition and processing, and has the ability to recognize features in the image, to provide visual feedback to the control application representing behavior of the test product and/or embedded system. In a system without image analysis capabilities, a robot may continue processing its steps without recognizing that something has gone wrong with a particular test product (for example, a paper tray is empty, an output tray is full, or an unexpected warning/error message appears on a screen).

In step 800, the control application 104 requests an image analysis of the embedded system 122 and/or test product 120. In step 802, camera 124 takes a picture of the embedded system 122 and/or test product 120. In step 804, camera 124 transmits the image data to image acquisition module 108. In step 806, image acquisition module 108 transmits the information to image processing module 114 which may be local or may reside on an independent server connected to the image processing module over a network. Then image processing module 114 analyzes the image in conjunction with information already stored in the database 116 (e.g., screen definition, button definitions, button placement definitions, etc.) using the two following techniques: (1) in step 808, using descriptors, which are intrinsic areas in an image that may be calculated by training a neural network to recognize, match, or otherwise compare an image using existing image data pertaining to various screens of the interface on an embedded system; and (2) in step 810, using an optical character recognition ("OCR") engine to recognize and extract glyphs, characters, or symbols from the image. In some embodiments, step 808 may also use an OCR engine to provide information used in automated identification of descriptors. The OCR engine may be a remote application accessible over a network, and can be shared by multiple requestors. For instance, multiple computing components may request the OCR engine to process an OCR task. In response, the OCR engine would handle the processing, including by using all available resources or by dedicating a limited set of resources, such as a single node, to execute the requested task.

The descriptors for step 808 may be computed at the start of image processing, and further recalculated by a neural network pending changes to the image being analyzed or to any existing image data. The evaluation of the image may include comparison of the computed or recalculated descriptors to any existing image data stored in database 116 or any other resource accessible by image processing module 114. Database 116 or such other accessible resources may include a central storage application that serves as a widely accessible data repository for information including, for example, image data. As such, multiple requestors may communicate with and obtain information from database 116 or such other accessible resources. Information stored in database 116 includes data specific to each screen of an interface, including images of each screen for different product models for each vendor. The evaluation may further include the use of probabilistic methods to analyze the screen based on image data from database 116. Such methods may include, but are not limited to, BRISK or ORB algorithms which can operate on descriptors for the purposes of detection and matching. The methods may detect particular descriptors of images and compare them to image data from database 116 or other resources accessible by image processing module 114 to identify a match based on the descriptors. Using this information, the two techniques above permit the image processing module to identify the screen with which the robotic handler needs to interact, and also whether there is a warning, error, or other condition from which the robotic handler must recover. The descriptors can be enough to identify the correct screen in many instances, which means the image processing flow can end after step 808. When the descriptors are not enough to identify the screen, the flow progresses to step 810, in which image processing module 114 may use OCR to recognize and extract words from the image as a source of additional information to assist in identifying the correct screen.

FIG. 11 is a sample test that can be run in an automated testing platform, according to one embodiment of the invention. It is easy for an end user to prepare such tests, because the scripting language used consists of simple, structured language suitable for a person without specialized training to read and understand rather than complex computer code. The testing platform uses the shared test library module to translate the simple script, which uses keywords defined in or made accessible by the shared test library module, into specific commands for various components or modules of the test platform, which may include, e.g., instructions to capture or retrieve information from sensors or cameras; instructions to perform data processing or analysis of image data, sensor signals, or sensor data; instructions to submit information to, retrieve information from, or manipulate information within a database; or instructions for a robotic handler. These commands are processed and may be transmitted to the appropriate component or module of the test platform over the corresponding interface for that component or module. Note that the translation may differ for different vendors, printer models, or hardware/firmware versions on a test product. For example, the simple statement "When User is authenticated with PIN" may involve different PIN screens or different PIN formats depending on the test product. This system has two primary advantages: (1) a tester need not be an engineer with specific technical knowledge of how to work with a certain test product, and need only surmount a simple learning curve to understand the structured language used in the script, and (2) the testing platform can apply the same universal script to different test products by translating as needed based on the product-specific information stored in the database. The system is also advantageous over existing testing methods in that it permits the tester to design and conduct not only verification testing but also validation testing. Verification testing may include checking specific features of a system to evaluate whether they perform appropriately and return the expected result pursuant to product specifications for the system. Validation testing relates to a different type of testing that focuses less on specification compliance and more on whether the product satisfies the needs of a user. Validation testing may include evaluating higher level characteristics of a product such as the overall speed of a system, reliability of a system over time, consistency of results across multiple tasks, and other areas that tend to be difficult or impossible for an individual tester to determine based on individual manual testing.

The automated testing platform may run into certain conditions from which it can attempt to recover. There are two types of conditions: (1) anticipated, for which there is a designated recovery route, and (2) unanticipated. One example of an anticipated condition could be an instance where entry of a PIN code for authentication to the test product did not succeed, because the entered PIN did not match the expected format on the test product. In such an instance, the control application would be aware of the error status because the camera would have taken an image of the error window indicating that the PIN code is incorrect, of the wrong format, not recognized, etc. In this event the image processing module would recognize the message indicates invalid credentials, and the control application could instruct the robotic handler to input a PIN code in a different format.

For an unanticipated condition, there are again two types: (1) the kind of unanticipated condition that results in navigation to a screen in the embedded system from which the control application can return to a known screen or state in the test flow, and (2) the kind of unanticipated condition that leaves the control application without any explicit recovery instructions. For the former case, the control application is able to guide the robotic handler to press the appropriate buttons on the screen to navigate to the appropriate screen or state so that it may continue the test flow. As an example, if the control application is trying to test print jobs #1 and #3 but for some reason #2 and #4 are also selected, the application may instruct the robotic handler to deselect #2 and #4 before proceeding. For the latter case, the control application may instruct the robotic handler to press the appropriate "OK" or "Cancel" buttons on a screen to reset the flow to a known state, and start over. After trying it again only to face the same unanticipated error condition, the control application could submit a notification to an administrator to go check the status of the machine and, if necessary, input an appropriate recovery procedure in the future. It should be understood that it would be undesirable for the automated testing platform to always recover from every unanticipated condition, as at least some of those conditions may represent a defect in the test product which must be noticed and fixed in the test product, not in the control application.

The invention, by providing an automated testing platform for embedded systems, significantly improves the state of the art with respect to standard testing procedures. The consistency and speed of a robotic handler permits testing to be conducted at a higher volume and level of precision when compared to manual testing, for example. Additionally, the results of performing the tests can be more granular and complete. The test scripts are completely reproducible at an exact level not only in terms of steps taken, but down to the level of precise timing, location, and even force of button presses. These tests can determine certain product qualities which would be difficult or impossible to ascertain through other forms of testing, such as the responsiveness of a user interface to an end user or the amount of time required for various tasks to be accomplished. Finally, the universality of the script language and the ability of the control application to recover from certain unanticipated conditions results in increased flexibility, for instance across different printer models or hardware/firmware versions, and less total test scripts to prepare to achieve the same level of test coverage as was previously possible.

With respect to detecting the amount of time required for various tasks to be accomplished, it is preferable to achieve an accurate measurement of time, and even more so when multiple components (each with their own mechanisms for tracking time) are involved in a test process. Rather than adjusting and using the system time of each component, it can be advantageous to keep track of the difference between a reference time and the local system time for a component. Keeping track of such differences makes it possible to maintain consistency in time measurements by ensuring each measured time from a local component is synchronized to the same reference time. Maintaining the time difference at application rather than system level can also be advantageous as it minimizes disruption to other processes running on the system.

Other objects, advantages and embodiments of the various aspects of the present invention will be apparent to those who are skilled in the field of the invention and are within the scope of the description and the accompanying Figures. For example, but without limitation, structural or functional elements might be rearranged, or method steps reordered, consistent with the present invention. Similarly, principles according to the present invention could be applied to other examples, which, even if not specifically described here in detail, would nevertheless be within the scope of the present invention. For example, the principles of the present invention are not limited to testing printers, but could be used to test any product with an embedded system.

What is claimed is:

1. A system for testing a feature of an embedded system, comprising:
    a computing device comprising:
        a low-powered computing component communicatively coupled to a control application interface, a sensor interface, and a robotic interface, wherein the low-powered computing component is configured to:
            receive from the sensor interface a plurality of sensor signals generated during a test of the feature of the embedded system,
            provide over the control application interface sensor data corresponding to the plurality of sensor signals,
            receive over the control application interface a plurality of commands for the test of the feature,
            provide over the robotic interface a plurality of instructions for movement of a robotic handler corresponding to at least one of the plurality of commands for the test of the feature, and
            consume less than 25 watts; and
        a computing component communicatively coupled to the control application interface, an image processing interface, and a database interface, wherein the computing component is configured to:
            receive from the control application interface the sensor data, receive from the image processing interface image data corresponding to a plurality of images of the embedded system captured during the test of the feature,
            receive from the database interface a plurality of tests capable of being performed on the feature,
            provide over the control application interface a plurality of commands for the test of the feature.

2. A system according to claim 1, wherein said computing component is connected to a network, wherein said computing device is configured to transmit status data of said test and said robotic handler to a user over the network.

3. A system according to claim 2, wherein said computing component is configured to communicate with a user over the network and permit the use or modification of an application running on the computing device by the user.

4. A system according to claim 1, wherein the low-powered computing component is configured to process the sensor signals prior to providing the sensor data over the control application interface.

5. A system according to claim 1, wherein the low-powered computing component is configured to process the plurality of commands prior to providing the plurality of instructions over the robotic interface.

6. A system according to claim 1, wherein the computing component is communicatively coupled to a sensor data processing interface, wherein the computing device receives over the sensor data processing interface processed sensor data corresponding to sensor data captured during the test of the feature.

7. A system according to claim 1, wherein at least one of the low-powered computing component and the computing component is configured to be synchronized, at an application level, to a same reference time as another computing device.

8. A system according to claim 1, wherein at least one of the plurality of tests comprises a plurality of keywords, and the computing component is configured to translate the keywords into commands capable of being performed by the robotic handler.

9. A system according to claim 1, wherein at least one of the plurality of tests comprises a plurality of keywords, and the computing component is configured to translate the keywords into commands for transmission over an interface.

10. A system according to claim 1, wherein the sensor data or image data correspond to three-dimensional (3D) aspects of the embedded system or a test product of which the embedded system is a part.

11. A system according to claim 1, wherein the feature is a two-dimensional (2D) feature.

12. The system of claim 1, wherein the low-powered computing component and the computing component are separate components of the computing device.

13. A method for testing a feature of an embedded system performed by a computing device comprising a low-powered computing component, consuming less than 25 watts, and a computing component, the method comprising:
    receiving from a sensor interface, by the low-powered computing component, a plurality of sensor signals generated during a test of the feature of the embedded system,
    providing over a control application interface, by the low-powered computing component, sensor data corresponding to the plurality of sensor signals,
    receiving from a control application interface, by the low-powered computing component, a plurality of commands for the test of the feature,
    providing over a robotic interface, by the lower-powered computing component, a plurality of instructions for movement of a robotic handler corresponding to at least one of the plurality of commands for the test of the feature; and
    receiving from the control application interface, by the computing component, the sensor data,
    receiving from an image processing interface, by the computing component, image data corresponding to a plurality of images of the embedded system captured during the test of the feature,
    receiving from a database interface, by the computing component, a plurality of tests capable of being performed on the feature,
    providing over the control application interface, by the computing component, a plurality of commands for the test of the feature.

14. A method according to claim 13, wherein said computing component is connected to a network, wherein said computing device is configured to transmit status data of said test and said robotic handler to a user over the network.

15. A method according to claim 14, wherein said computing component communicates with a user over the network, receives requests for the use or modification of an application running on the computing device, and processes the requests.

16. A method according to claim 13, wherein the low-powered computing component processes the sensor signals prior to providing the sensor data over the control application interface.

17. A method according to claim 13, wherein the low-powered computing component processes the plurality of commands prior to providing the plurality of instructions over the robotic interface.

18. A method according to claim 13, wherein the computing component is communicatively coupled to a sensor data processing interface, wherein the computing component receives over the sensor data processing interface processed sensor data corresponding to sensor data captured during the test of the feature.

19. A method according to claim 13, wherein at least one of the low-powered computing component and the computing component synchronizes to a same reference time as another computing component, at an application level.

20. A method according to claim 13, wherein at least one of the plurality of tests comprises a plurality of keywords, and the computing device translates the keywords into commands capable of being performed by the robotic handler.

21. A method according to claim 13, wherein at least one of the plurality of tests comprises a plurality of keywords, and the computing component is configured to translate the keywords into commands for transmission over an interface.

22. A method according to claim 13, wherein the sensor data or image data correspond to three-dimensional (3D) aspects of the embedded system or a test product of which the embedded system is a part.

23. A method according to claim 13, wherein the feature is a two-dimensional (2D) feature.

24. The method of claim 13, wherein the low-powered computing component and the computing component are separate devices of the computing device.

* * * * *